United States Patent [19]

Hutson

[11] 4,166,224
[45] Aug. 28, 1979

[54] PHOTOSENSITIVE ZERO VOLTAGE SEMICONDUCTOR SWITCHING DEVICE

[76] Inventor: Jearld L. Hutson, P.O. Box 34235, Dallas, Tex. 75234

[21] Appl. No.: 807,512

[22] Filed: Jun. 17, 1977

[51] Int. Cl.$^2$ ............... H03K 3/42; H01L 27/14; H01L 29/75
[52] U.S. Cl. ............... 307/311; 307/252 R; 357/30; 250/211 J
[58] Field of Search ............... 307/311, 252 R; 250/211 J; 357/19, 30, 38

[56] References Cited

U.S. PATENT DOCUMENTS

| 3,535,532 | 10/1970 | Merryman | 250/211 J |
| 3,970,843 | 7/1976 | Dumas | 357/30 |
| 4,027,322 | 5/1977 | Heinecke | 357/19 |

OTHER PUBLICATIONS

"Light-activated Switch Expands Uses of Silicon Controlled Rectifiers", by E. Keith Howell, Electronics Mag., vol. 37, No. 5, 5/4/64, pp. 53-59.

Primary Examiner—Stanley D. Miller, Jr.
Assistant Examiner—B. P. Davis
Attorney, Agent, or Firm—Richards, Harris & Medlock

[57] ABSTRACT

A multilayer semiconductor switching device having alternating layers of opposite conductivity type is provided which is sensitive to impinging photon flux. The switching device has first, second and third electrodes and has a predetermined holding voltage. The switching device is constructed to receive photon flux from an external source and has variable output characteristics dependent upon the impinging photon flux. At least one photovoltaic device is disposed adjacent the semiconductor switching device for also receiving impinging photon flux and is connected across the first and second electrodes of the switching device. The photovoltaic device is operable in response to the impinging photon flux for generating a voltage greater than the holding voltage of the switching device and for applying the voltage across the first and second electrodes. The switching device generates base drive in response to the impinging photon flux. The first and third electrodes of the switching device are operable to receive an external voltage, such that a substantial change in impedance results across the first and third electrodes when the external voltage is less than the voltage generated by the photovoltaic device.

12 Claims, 5 Drawing Figures

PHOTOSENSITIVE ZERO VOLTAGE SEMICONDUCTOR SWITCHING DEVICE

FIELD OF THE INVENTION

This invention relates to semiconductor devices, and more particularly relates to a zero voltage semiconductor switching device which is photosensitive.

THE PRIOR ART

Semiconductor switching devices such as silicon controlled rectifiers are sensitive to changing voltages which can cause these devices to be rendered conductive prematurely. It is therefore often desirable that such switching devices operate as zero voltage switches to be rendered conductive only if the voltage between the anode and cathode is below a predetermined level. Such switching devices also require an external source of voltage to supply base drive to internal PN junctions.

However, such previously developed zero voltage semiconductor devices have often been excessively bulky and have been formed on several different semiconductor bodies. Such prior devices have thus often been relatively expensive to fabricate and to interconnect, and have often not provided completely satisfactory performance characteristics. Prior devices have also often required separate sources of electrical power, when it would be advantageous to operate the device with only a single electrical power source. A need has thus arisen for a semiconductor switching device which is not sensitive to a changing anode and cathode voltage and which may be rendered conductive from an external source such as an illuminating source.

SUMMARY OF THE INVENTION

The present invention provides for a semiconductor switching device formed on a unitary semiconductor body and having variable output characteristics dependent upon impinging photon flux. The switching device includes alternating layers of opposite conductivity type and first, second and third electrodes. The switching device has a predetermined holding voltage and is constructed to receive photon flux from an external source. The switching device further includes a photovoltaic device disposed adjacent to the semiconductor switching device for also receiving impinging photon flux and connected across the first and second electrodes of the switching device. The photovoltaic device is operable in response to impinging photon flux for generating a voltage greater than the holding voltage of the switching device and for applying this voltage across the first and second electrodes. The first and third electrodes of the switching device are operable to receive an external voltage, such that a substantial change in impedance results across the first and third electrodes when the external voltage is less than the voltage generated by the photovoltaic device.

In accordance with another aspect of the present invention, a multilayer semiconductor switching device is formed in a unitary semiconductor body and includes a plurality of semiconductor layers of alternating first and second conductivity types. An external layer of the body is composed of a first conductivity type. A first region of the second conductivity type is formed within one of the external layers. Second regions of the first conductivity type are formed within the first region. The first and second regions are electrically isolated to form a plurality of photovoltaic devices for generating a voltage in response to impinging photon flux. Junctions are formed between the first and second regions for receiving impinging photon flux. The semiconductor switching device further includes a cathode electrode contacting the first region and a collector electrode contacting one of the semiconductor external layers to form a semiconductor switching device disposed between the cathode and collector electrodes and having a predetermined holding voltage. The semiconductor switching device is operable to receive a biasing voltage between the cathode and collector electrodes such that when light impinges upon the plurality of photovoltaic devices, a voltage is generated to substantially change the impedance between the cathode and collector electrodes when the voltage generated by the photovoltaic device is greater than the holding voltage of the semiconductor switching device.

DESCRIPTION OF THE DRAWINGS

For a more complete understanding of the present invention and for further objects and advantages thereof, reference is now made to the following description taken in conjunction with the accompanying drawings, in which.

DESCRIPTION OF THE PREFERRED EMBODIMENT

Figure 1:
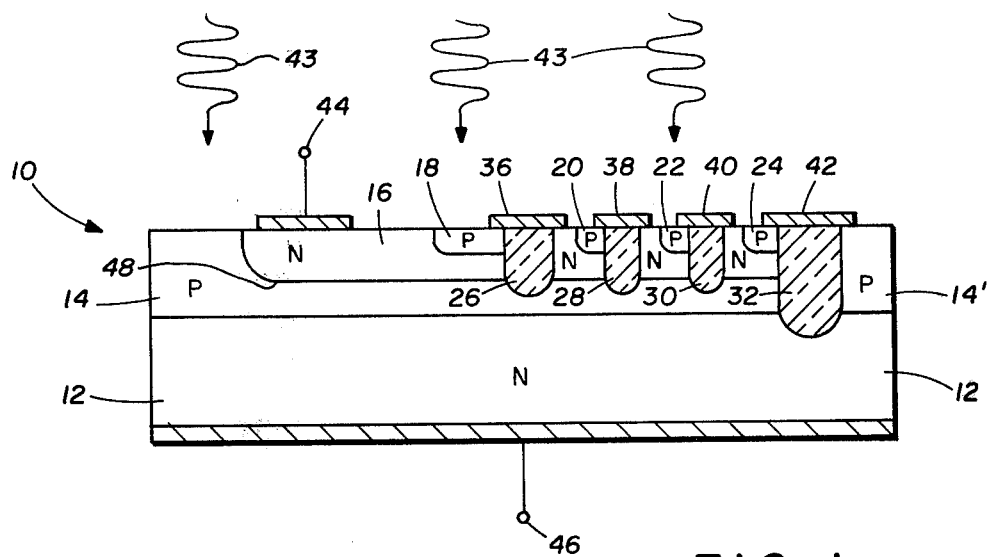
FIG. 1 is a diagrammatical sectional view of the semiconductor switching device of the present invention.

Referring to FIG. 1, a unitary semiconductor body 10 includes an N-type semiconductor layer 12 and a P-type semiconductor layer 14. A region of N-type semiconductor material 16 is formed in layer 14. Discrete regions of P-type semiconductor material 18, 20, 22 and 24 are formed within region 16. Grooves 26, 28, 30 and 32 are formed through region 16 and layer 14 with groove 32 extending to layer 12 and are filled with passivating material such as glass or the like to electrically separate and isolate P-type semiconductor material regions 18, 20, 22 and 24 from areas of N-type material within region 16. Groove 32 also isolates a region 14' of P-type semiconductor material from region 16 and layer 14.

FIG. 1 represents one embodiment of the semiconductor switch, however, it will be understood that several other configurations of the semiconductor body 10 can be utilized. For example, a quadrilateral configuration having region 14' at the center of four areas of N-type region 16 and separated by grooves 26 and 30 lying perpendicular to grooves 28 and 32 can be utilized.

Four photovoltaic diodes are formed on the semiconductor body 10 by forming PN junctions across the isolating grooves 26, 28, 30 and 32 using connecting terminals 36, 38, 40 and 42. The terminals 36, 38, 40 and 42 and the PN junctions are disposed on the semiconductor body 10 to receive impinging photon flux 43 from an external source to generate a photovoltaic voltage within the semiconductor body 10.

The semiconductor switch portion of the semiconductor body 10 comprises N region 16 and P and N layers 14 and 12. Region 16 includes a terminal 44 representing the cathode of the semiconductor switch, while layer 12 includes terminal 46 representing the collector of the semiconductor switch portion of body 10. A PN junction 48 is formed between N region 16 and P layer 14 to form the base drive area for the semiconductor switch portion of the semiconductor body 10. The switch further includes an internally connected anode terminal connected to the photovoltaic diodes.

Figure 2:
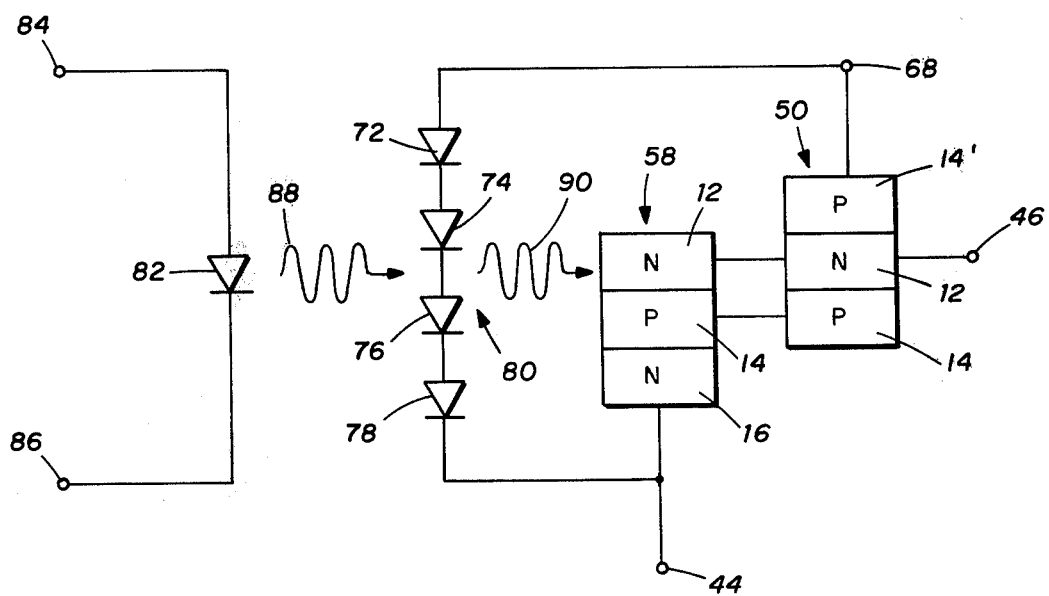
FIG. 2 is a schematic representation of the semiconductor switching device illustrated in FIG. 1.

Referring to FIG. 2, the semiconductor switch of FIG. 1 is schematically illustrated wherein like numerals are used for like and corresponding elements. The semiconductor switch is illustrated as comprising a PNP transistor 50 and an NPN transistor 58 having common collector junctions. The PNP transistor 50 is formed from the P-type semiconductor material of region 14', by the N-type semiconductor material layer 12 and the remainder of the P-type semiconductor material layer 14. The NPN transistor 58 is formed from the N-type semiconductor material layer 12, P-type semiconductor material layer 14 and the N-type semiconductor material region 16. Layers 12 and 14 may be seen to comprise common interconnected portions of the two devices 50 and 58. The collector terminal of the semiconductor switch is represented at 46. The anode terminal of the switch is represented at 68, while the cathode terminal connected to N-type semiconductor material region 16 is represented at 44. The four diodes formed in the N-type semiconductor material region 16 and the P-type semiconductor layer 14 of FIG. 1 are illustrated as diodes 72, 74, 76 and 78. Diodes 72, 74, 76 and 78 form a diode string 80 serially interconnected between the anode terminal 68 and cathode terminal 44 of the transistors 50 and 58.

An external source of photon flux is provided by any suitable source such as a light emitting diode 82, having terminals 84 and 86 to receive an external voltage source. Light emitting diode 82 generates photons represented by light waves 88 and 90, which impinge upon the diode string 80 and the semiconductor switch portion of the semiconductor body 10. While four diodes 72, 74, 76 and 78 are illustrated, it will be understood that more or less diodes may be used.

In operation of the preferred embodiment of the present zero voltage semiconductor switching device, an external biasing voltage is applied between terminals 44 and 46. Due to the appropriate selection of the dopant levels and dimensions of the semiconductor layers of transistors 50 and 58, the semiconductor switch has a predetermined holding voltage and gain. As is known, the holding voltage is defined as that voltage measured at the value of the holding current for the semiconductor switch. Further, the semiconductor switch comprising the transistors 50 and 58 is constructed to receive impinging photon flux and to be light sensitive to generate a voltage in response thereto. The output characteristics of the switch are thus dependant upon the impinging photon flux.

The impinging photon flux 88 from light emitting diode 82 causes the photovoltaic diodes 72, 74, 76 and 78 to generate a voltage which is greater than the holding voltage of the semiconductor switch and applies this voltage across terminals 68 and 44. The voltage generated by diodes 72, 74, 76 and 78 thus provides anode to cathode current for the semiconductor switching device. Base drive for the semiconductor switching device is provided by the impinging photon flux 90 onto the switch portion of the semiconductor body 10 which is also photosensitive. The base drive is generated in the area of PN junction 48 (FIG. 1) such that holes flow towards the cathode electrode 44 while electrons flow towards the N-type semiconductor material layer 12. This base drive in cooperation with the anode to cathode current generated by the impinging photon flux 88 on the diode string 80 causes conduction of the switch, thereby causing a substantial reduction in impedence across the semiconductor switch between terminals 44 and 46 when the external biasing voltage applied between terminals 44 and 46 is less than the anode to cathode voltage generated by the diode string 80. The semiconductor switching device cannot be actuated when the external biasing voltage is greater than the voltage level set by the diodes 72, 74, 76 and 78.

Figure 3:
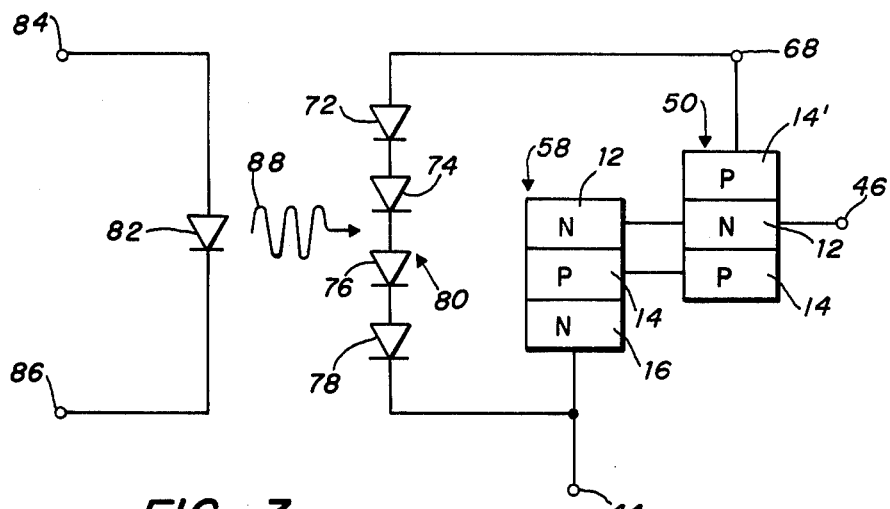
FIG. 3 is a schematic representation of the semiconductor switching device illustrated in FIG. 1 showing a second embodiment of the present invention.

Referring to FIG. 3, a second embodiment of the present semiconductor switch is schematically illustrated wherein like numerals are used for like and corresponding elements. The fabrication of the semiconductor layers comprising this embodiment of the semiconductor switch can be modified and the dopant levels of the layers controlled to change the gain of the semiconductor switch, such that the base drive required to actuate the semiconductor switch is substantially reduced. In such a configuration, the semiconductor switch can be masked to prevent photon flux 90 (FIG. 2) from impinging upon the semiconductor switch area of the body 10, or the main semiconductor switch area can be constructed so as not to be sensitive to the photon flux. In this embodiment, the low required base drive will be provided by the photovoltaic diodes connected across the anode and cathode 68 and 44 of the semiconductor switch. The semiconductor switch in this configuration is operable in the manner previously described, except that the photon flux only causes photovoltaic outputs from diodes 72, 74, 76 and 78.

Figure 4:
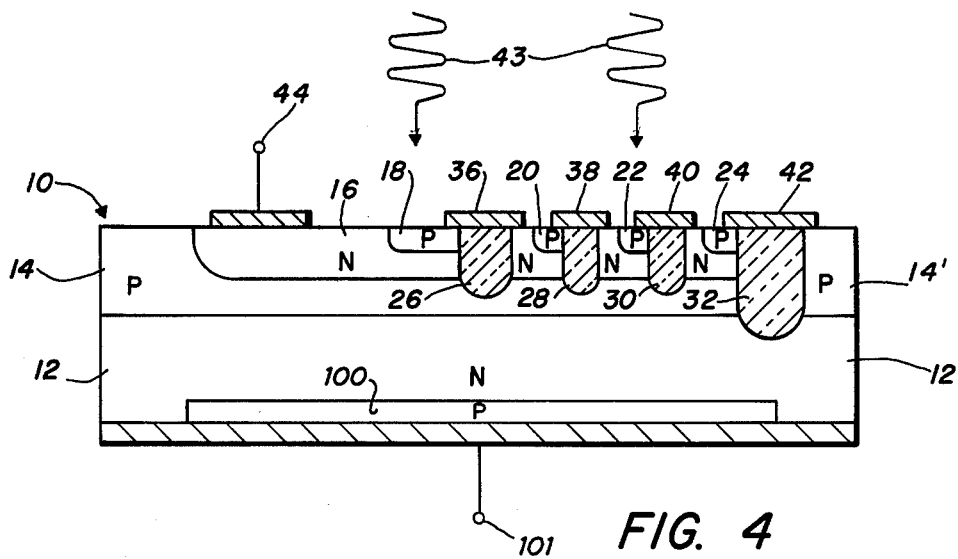
FIG. 4 is a diagrammatical sectional view of a third embodiment of the semiconductor switching device of the present invention.

Referring to FIG. 4, a third embodiment of the present semiconductor switch is illustrated wherein like numerals are used for like and corresponding elements. In this embodiment, a P-type semiconductor region 100 is formed within the N-type semiconductor material layer 12 and contacts a terminal 101. This additional region 100 enables terminal 101 to serve as a second anode terminal for the semiconductor switch. However, this configuration has a disadvantage of making the semiconductor switching device more rate sensitive.

Figure 5:
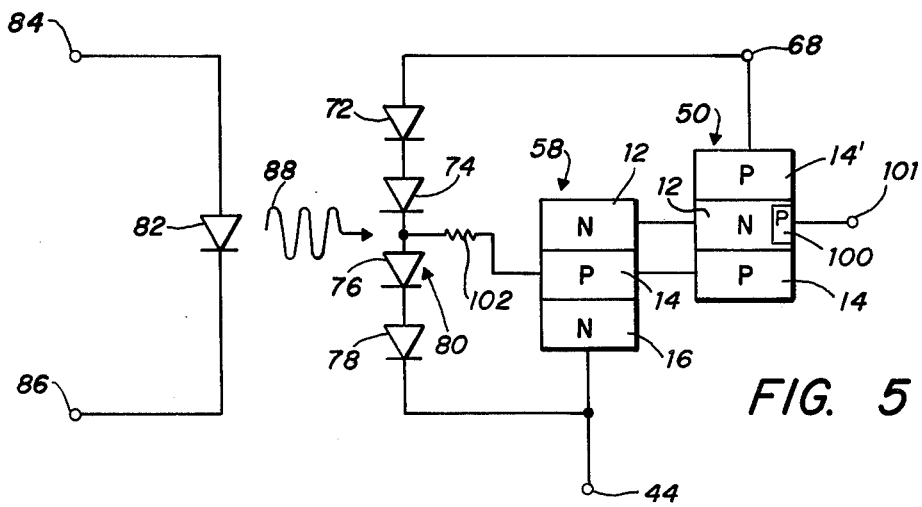
FIG. 5 is a schematic representation of the semiconductor switching device illustrated in FIG. 3 showing a fourth embodiment of the present invention.

Referring to FIG. 5, a fourth embodiment of the present semiconductor switch is illustrated which incorporates the third embodiment wherein like numerals are used for like and corresponding elements. In this embodiment, a resistive element 102 is fabricated between the P-type semiconductor material layer 14 of the transistor 58 and the junction between diodes 74 and 76 to further regulate the base drive generated by diodes 72, 74, 76 and 78. In this embodiment, the switch portion of the device would not be required to be photosensitive.

Although the embodiment of the semiconductor switch of the present invention is shown as an silicon controlled rectifier type device, it will be understood that the same concepts of the present invention can be utilized in other types of thyristors. Other types of thyristors or semiconductor switching devices having at least one thyristor or regenerative switching action can be utilized in the present invention. Although a four layer switching device is shown, it will be understood that a semiconductor switch having greater than four layers can be utilized.

The device shown in FIGS. 1 and 4 may be formed in any one of a number of suitable techniques well known in the art. For example, an N-type semiconductor material silicon wafer may be diffused on one side to form the layer 14. The N-type semiconductor region 16 may then be formed in layer 14 by conventional diffusion techniques using suitable dopants or impurities which are compatible with the particular semiconductor material being operated upon. The particular size and shapes of the diffused regions are of course determined by suitable masking and photographic techniques conventionally employed in semiconductor diffusion technology. It will be understood that any suitable semiconductor material may be utilized to form the semiconductor switching device according to the present invention, but for clarity of illustration, reference is made in the drawings to particular conductivity types. Of course, electrical conductivity types herein specified may be interchanged and reversed. The various doping levels of the present invention are well known in the art and are therefore not described specifically.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. In a multilayer semiconductor switching device having a base region and alternating layers of opposite conductivity types and first, second and third electrodes, the switching device having a predetermined holding voltage and being constructed to receive photon flux from an external source and having variable output characteristics dependent upon the impinging photon flux, the combination comprising:
   photovoltaic means for also receiving impinging photon flux and connected across the first and second electrodes of the switching device;
   said photovoltaic means operable in response to impinging photon flux for generating a voltage greater than the holding voltage of the semiconductor switching device and for applying said voltage across the first and second electrodes;
   said switching device generating a base drive voltage in the area of said base region in response to the impinging photon flux; and
   the first and third electrodes of the semiconductor switching device operable to receive an external voltage, such that at least one switching action occurs to provide a substantial change in impedence across the first and third electrodes when said external voltage is less than the voltage generated by said photovoltaic means and wherein no substantial change in impedance results across the first and third electrodes when said external voltage is greater than the voltage generated by said photovoltaic means.

2. The semiconductor switching device of claim 1 wherein the voltage supplied by said photovoltaic means is applied to the first and second electrodes to forward bias the semiconductor switching device.

3. The semiconductor switching device of claim 1 wherein said photovoltaic means comprises at least one diode.

4. The semiconductor switching device of claim 1 wherein said first electrode comprises a cathode electrode and said second electrode comprises an anode electrode such that said photovoltaic means generates anode to cathode current for the semiconductor switching device.

5. A zero voltage semiconductor switching device having anode and cathode electrodes comprising:
   a unitary semiconductor body having a plurality of semiconductor layers of alternating conductivity types and a base region;
   photovoltaic means formed within said semiconductor body for receiving impinging photon flux from an external source;
   a switching device formed in said body adjacent said photovoltaic means and having a predetermined holding voltage;
   said photovoltaic means operable in response to impinging photon flux for generating a voltage greater than the holding voltage of the semiconductor switching device; and
   said switching device operable to provide at least one switching action to present a substantial change in impedance when an external voltage is applied to said switching device which is less than the voltage generated by said photovoltaic means and wherein said switching device is not affected by the impingement of photon flux such that only said photovoltaic means generates a voltage in response to impinging photon flux.

6. The semiconductor switching device of claim 5 wherein said switching device is disposed to receive impinging photon flux from an external source and is responsive thereto for generating an internal base drive voltage in the area of said base region.

7. The semiconductor switching device of claim 5 and further including resistive means interconnected between said photovoltaic means and said switching device.

8. The semiconductor switching device of claim 5 wherein said photovoltaic means is connected across the anode and cathode electrodes of the semiconductor switching device to generate anode to cathode current within said switching device.

9. A multilayer semiconductor switching device formed in a unitary semiconductor body comprising:
   a semiconductor body having a plurality of semiconductor layers of alternating first and second semiconductor conductivity types and a base region;
   an external layer of said semiconductor body being of a first conductivity type;
   a first region of a second conductivity type being formed within said external layer;
   second regions of a first conductivity type being formed within said first region;
   isolating means formed between areas of said first and second regions to form a plurality of photovoltaic means for generating a voltage in response to impinging photon flux;
   means disposed adjacent said isolating means to form junctions between said first and second regions for receiving impinging photon flux;
   a first electrode contacting said first region;
   a second electrode contacting a second external layer of said semiconductor body to form a switching device disposed between said first and second electrodes and having a predetermined holding voltage; and means for applying an external biasing voltage to said semiconductor switching device between said first and second electrodes such that when light impinges upon said plurality of photovoltaic means a voltage is generated to provide a base drive voltage in the area of said base region to said switching device to substantially change the impedence between said first and second electrodes when said voltage generated by said photovoltaic means is greater than the holding voltage of said switching device.

10. The semiconductor switching device of claim 9 wherein said switch device comprises:

a two layer semiconductor switch having at least one of said isolating means extending throughout a portion of both of said layers.

11. The semiconductor switching device of claim 9 wherein said means disposed adjacent said isolating means comprises electrodes for connecting said first and second regions.

12. The semiconductor switching device of claim 9 wherein no substantial change in impedence results across said first and second electrodes when said external biasing voltage is greater than the voltage generated by said photovoltaic means.

* * * * *